US011372335B2

(12) United States Patent
Gonchar (10) Patent No.: US 11,372,335 B2
(45) Date of Patent: Jun. 28, 2022

(54) OPTICAL ARRANGEMENT FOR EUV LITHOGRAPHY (71) Applicant: Carl Zeiss SMT GmbH, Oberkochen (DE)

(72) Inventor: Anastasia Gonchar, Ulm (DE)

(73) Assignee: CARL ZEISS SMT GMBH, Oberkochen (DE)

( * ) Notice: Subject to any disclaimer, the term of this patent is extended or adjusted under 35 U.S.C. 154(b) by 0 days.

(21) Appl. No.: 17/026,925

(22) Filed: Sep. 21, 2020

(65) Prior Publication Data

US 2021/0003926 A1  Jan. 7, 2021

Related U.S. Application Data (63) Continuation of application No. PCT/EP2019/056371, filed on Mar. 14, 2019.

(30) Foreign Application Priority Data

Mar. 22, 2018 (DE) ............... 10 2018 204 364.7

(51) Int. Cl.
*G03F 7/20* (2006.01)
*G02B 5/08* (2006.01)
*G02B 17/08* (2006.01)

(52) U.S. Cl.
CPC ....... *G03F 7/70316* (2013.01); *G02B 5/0808* (2013.01); *G02B 5/0891* (2013.01); *G02B 17/0892* (2013.01)

(58) Field of Classification Search
CPC ............. G03F 7/70925; G03F 7/70316; G02B 17/0892; G02B 5/0808; G02B 5/0891
(Continued)

(56) References Cited

U.S. PATENT DOCUMENTS

2008/0011967 A1* 1/2008 Van Herpen ........ G03F 7/70925
250/492.2
2012/0250144 A1* 10/2012 Ehm .................... B82Y 10/00
359/360
(Continued)

FOREIGN PATENT DOCUMENTS

DE  102015215014 A1  10/2015
DE  102017213176 A1   9/2017
(Continued)

OTHER PUBLICATIONS

German Office Action with English translation, application DE 102018204364.7, dated Nov. 30, 2018, 2 pages.
(Continued)

*Primary Examiner* — Hung V Nguyen
(74) *Attorney, Agent, or Firm* — Edell, Shapiro & Finnan, LLC (57) ABSTRACT An optical arrangement for EUV lithography, including: at least one component (23) having a main body (32) with at least one surface region (30) which is exposed to activated hydrogen ($H^+$, $H^*$) during operation of the optical arrangement. The main body (32) contains at least one material which forms at least one volatile hydride upon contact of the surface region (30) with the activated hydrogen ($H^+$, $H^*$). At the surface region, noble metal ions (38) are implanted into the main body (32) in order to prevent the formation of the volatile hydride.

20 Claims, 2 Drawing Sheets (58) Field of Classification Search
USPC .......................................................... 359/380
See application file for complete search history.

(56) References Cited

U.S. PATENT DOCUMENTS

| | | | |
|---|---|---|---|
| 2013/0186430 A1 | 7/2013 | Ehm et al. | |
| 2017/0212433 A1* | 7/2017 | Ehm | ................... G03F 7/70883 |
| 2020/0166847 A1* | 5/2020 | Liebaug | .............. G03F 7/70925 |

FOREIGN PATENT DOCUMENTS

| | | |
|---|---|---|
| DE | 102017213181 A1 | 1/2019 |
| JP | 2009086287 A | 4/2009 |

OTHER PUBLICATIONS

Cowie et al., "Reduced hydrogen embrittlement susceptibility in platinum implanted high strength steel", Nuclear Instruments and Methods in Physics Research B59/60 (1991), pp. 871-874.

Ensinger, "Protection against hydrogen embrittlement by ion beam mixing", Nuclear Instruments and Methods in Physics Research Section B: Beam Interactions with Materials and Atoms, vol. 39, Issues 1-4, Mar. 1989, pp. 552-555.

Ensinger, "The influence of platinum implantation on the hydrogen embrittlement of tantalum", Materials Science and Engineering, vol. 90, Jun. 1987, pp. 237-241.

Ramezani et al., "Microstructure and corrosion resistance of tantalum after nitrogen ion implantation", Corrosion Engineering, Science and Technology, May 2016, 8 pages.

Wood et al., "Diffusion an Meterogeneous Reaction II. Catalytic Activity of Solids for Hydrogen-Atom Recombination", The Journal of Chemical Physics 29, 1416 (1958), 3 pages.

International Search Report, PCT/EP2019/056371, dated Jun. 26, 2019, 3 pages.

Research Disclosure, www.researchdisclosure.com, (2013), ISSN 0374-4353, 9 pages.

Office Action in German counterpart application DE102018204364.7 (in German, no translation available).

* cited by examiner

OPTICAL ARRANGEMENT FOR EUV LITHOGRAPHY

CROSS-REFERENCE TO RELATED APPLICATION

This is a Continuation of International Application PCT/EP2019/056371, which has an international filing date of Mar. 14, 2019, and the disclosure of which is incorporated in its entirety into the present Continuation by reference. This Continuation also claims foreign priority under 35 U.S.C. § 119(a)-(d) to and also incorporates by reference, in its entirety, German Patent Application DE 10 2018 204 364.7 filed on Mar. 22, 2018.

FIELD OF THE INVENTION

The invention relates to an optical arrangement for extreme ultraviolet (EUV) lithography, comprising: at least one component having a main body with at least one surface region which is exposed to activated hydrogen during operation of the optical arrangement, wherein the main body contains at least one material which forms at least one volatile hydride upon contact of the surface region with the activated hydrogen.

BACKGROUND

The optical arrangement for EUV lithography can be an EUV lithography apparatus for the exposure of a wafer, or some other optical arrangement that uses EUV radiation, for example an EUV inspection system, e.g. an arrangement for measuring or for inspecting masks, wafers or the like used in EUV lithography.

An optical arrangement for EUV lithography is typically operated under vacuum conditions in order to prevent the residual gas present in the optical arrangement from absorbing the EUV radiation and thus reducing the transmission of the optical arrangement. The residual gas present in the vacuum environment of such an optical arrangement can be admixed with small quantities of hydrogen and/or of other reactive gases which provide a protective effect for reflective optical elements arranged in the vacuum environment and which exhibit only little absorption for the EUV radiation.

During operation of such an optical arrangement, for example of an EUV lithography apparatus, a hydrogen plasma typically forms in such a vacuum environment under the influence of the EUV radiation, that is to say that activated hydrogen in the form of hydrogen ions and/or hydrogen radicals is formed. On account of the etching attack—caused by the activated hydrogen—on uncovered, generally uncoated, surface regions of materials or of components in optical arrangements for EUV lithography, etching products in the form of hydrides can form there, which undergo transition to the gas phase and are released into the vacuum environment (so-called "Hydrogen-induced outgassing", HIO). Etching products of this type can deposit at the surfaces of the reflective optical elements, in particular in the optically used region, i.e. typically on a reflective coating. As a result of these deposits, the optical arrangement loses transmission for the EUV radiation and hence performance and productivity.

DE 10 2015 215 014 A1 describes an EUV projection exposure apparatus comprising a housing which defines an interior. Hydrogen ions and/or hydrogen radicals can arise in the interior during operation. The EUV projection exposure apparatus comprises a multiplicity of components which at least partly are accommodated in the interior and which at least partly comprise a layer composed of a noble metal, for example composed of Rh, Ru, Jr, Pd, Pt. The minimum layer thickness of the layer is chosen such that hydrogen ions and/or hydrogen radicals cannot penetrate through the layer. The layer thickness typically lies in the range of 50 nm to 1000 nm.

DE 102017213181.0 describes an optical arrangement for EUV radiation which comprises at least one reflective optical element having a main body with a coating that reflects EUV radiation. At least one shield is fitted to at least one surface region of the main body and protects the at least one surface region against the etching effect of a plasma surrounding the optical element during operation of the optical arrangement. In one exemplary embodiment, the shield is formed by a stop separated from the surface region of the main body by a gap. In another exemplary embodiment, the shield is applied directly on the surface region of the main body and can be formed for example from Ru, Rh, Jr, Pt, Au, Ni, Ti, Cu, $Al_2O_3$, or Pd. In a further exemplary embodiment, the shield forms a protective film connected indirectly to the surface region of the main body.

With the use of a shield in the form of a layer or a coating, a problem exists that this can become detached possibly under the influence of the activated hydrogen, for example because blisters form in the layer. A coating having a thickness of a plurality of nanometers or a protective film connected indirectly to the surface can additionally alter the surface shape (figure) of the main body. Moreover, the production costs of a layer composed e.g. of Ir, Pd, Pt or Rh are considerable. The use of a shield in the form of a stop is associated with additional assembly outlay and entails the risk of optical elements or other components being damaged during assembly.

SUMMARY

It is an object of the invention to provide an optical arrangement for EUV lithography in which the formation of volatile hydrides produced by activated hydrogen is reduced.

This and other objects are addressed, according to one formulation, with an optical arrangement of the type mentioned in the introduction in which noble metal ions are implanted at the surface region into the main body. The inventors have recognized that the formation of volatile hydrides can be significantly reduced by the implantation of noble metal ions in the region of the surface of the main body, in particular into a near-surface volume region below the surface. This exploits the fact that noble metal ions generally have a strong catalytic effect for the recombination of activated hydrogen, i.e. of hydrogen radicals and/or of hydrogen ions, to form atomic hydrogen. In contrast to the solutions described further above, the implantation of the noble metal ions involves carrying out only a doping of the main body, and without the need to form a separate layer, with the result that the problems that occur with the use of a coating, such as delamination or an alteration of the figure of the main body, can typically be avoided.

In one embodiment, the implanted noble metal ions are selected from the group comprising: Pt, Pd, Au, Rh, Ir. Pt, in particular, has a very strong catalytic effect for the recombination of activated or of atomic hydrogen, cf. for example the article "Diffusion and Heterogeneous Reaction. II. Catalytic Activity of Solids for Hydrogen-Atom Recombination", B. J. Wood, H. Wise, The Journal of Chemical Physics, 29, 1416 (1958), which specifies the recombination coefficients for a number of different materials. The effectiveness of the implantation of Pt ions for the recombination of atomic or activated hydrogen to form molecular hydrogen is described for example in the article "The influence of platinum implantation on the hydrogen embrittlement of tantalum", W. Ensinger, G. K. Wolf, Materials Science and Engineering, Vol. 90, 1987, 237-241, the article "Protection against hydrogen embrittlement by ion beam mixing", W. Ensinger, G. K. Wolf, Nuclear Instruments and Methods in Physics Research B, Vol. 39, 1989, pp. 552-555, or the article "Reduced hydrogen embrittlement susceptibility in platinum implanted high strength steel", J. G. Cowie et al., Nuclear Instruments and Methods in Physics Research B59/60, 1991, pages 871-874.

In a further embodiment, the material which forms the volatile hydride is selected from the group comprising: Si, Ge, Sn, Zn, In. The material which forms the volatile hydride upon contact with the activated hydrogen is not necessarily present in pure form, but rather generally in the form of a compound or an alloy. By way of example, the main body of the component can be formed from quartz glass ($SiO_2$), wherein the Si contained in the quartz glass constitutes the material which forms the volatile hydride. The content of the material forming the volatile hydride in the main body can lie for example between approximately 1 at. % and 100 at. %, i.e. the main body can, if appropriate, completely consist of the material forming the volatile hydride.

In a further embodiment, the noble metal ions are implanted in a near-surface volume region of the main body, which is adjacent to the surface region, with an implantation depth of between 0.5 nm and 1000 nm, preferably between 0.5 nm and 100 nm. The implantation of the noble metal ions can be carried out for example by so-called plasma immersion ion implantation or ion implantation with a linear accelerator. In the latter case, the implantation of the ions is carried out by bombarding the surface of the main body with the noble metal ions. The ion dose during the implantation of the noble metal ions can lie for example between $10^{11}/cm^2$ and $10^{17}/cm^2$, preferably between $10^{11}/cm^2$ and $10^{15}/cm^2$. The concentration of the ions in the main body is dependent on the ion dose and additionally on the implantation time and the material structure of the main body, in particular on the diffusion coefficient.

In a further embodiment, the noble metal ions are implanted into the main body in clusters of not more than 200 atoms. As was described further above, it is advantageous if the ions do not form a continuous layer in the main body, rather only a doping of the main body with the ions is carried out. The formation of a continuous layer during the ion implantation can be prevented for example by the ion dose during the implantation being chosen not to be too large and lying in particular in the range of values indicated above.

In a further embodiment, boron ions, phosphorous ions, nitrogen ions and/or noble gas ions, e.g. He ions and/or Ar ions, are implanted (in addition to the noble metal ions) into the main body in the region of the surface. The additional implantation of nitrogen ions, but also of noble gas ions, can alter the microscopic structure of the main body and have an advantageous effect on the interaction with hydrogen, as is described for example in the article "Microstructure and corrosion resistance of tantalum after nitrogen ion implantation", A. H. Ramezani et al., Corrosion Engineering, Science and Technology, 2016, vol. 51, No. 6, pages 393-399. The implantation of boron ions and/or of phosphorous ions has also proved to be advantageous.

In a further embodiment, the main body forms a substrate of a reflective optical element, and a reflective coating for reflecting EUV radiation is applied on the main body. The surface region of the main body into which the ions are implanted is typically formed outside the surface region on which the reflective coating is applied. The surface region at which the ions are implanted can be for example a circumferential side surface of the main body, a surface region at that side of the optical element at which the reflective coating is applied, or the rear side of the main body of the reflective optical element. The reflective coating can be applied directly on the main body, but it is also possible for one or more functional layers used for example for protecting the main body or as adhesion promoter to be arranged between the reflective coating and the main body.

The reflective optical element can be operated for example under normal incidence (referred to as: "normal incidence mirror"), i.e. with comparatively small angles of incidence relative to the surface normal, as is the case for example for a collector mirror. In this case, the reflective coating can be configured as a multilayer coating which acts as an interference layer system for an operating wavelength of the EUV lithography apparatus. By way of example, the multilayer coating can comprise alternating layers of molybdenum and silicon.

The optical element can also be a reflective optical element configured for grazing incidence (referred to as: "grazing incidence mirror"). A reflective optical element of this type is typically configured for the reflection of radiation at an angle of incidence which is greater than 60 degrees, is greater than 65 degrees or is greater than 70 degrees relative to the surface normal.

In one development, the main body is formed from quartz glass, in particular from titanium-doped quartz glass, which is offered e.g. under the trade name ULE®, from a glass ceramic, for example a glass ceramic offered under the trade name Zerodur®, or from silicon, in particular from mono- or polycrystalline silicon.

Particularly in the case of optical elements used in a projection lens of an EUV lithography apparatus, it is necessary to use materials for the main body which exhibit the least possible change in the coefficient of thermal expansion depending on temperature, as is the case for titanium-doped quartz glass or for specific glass ceramics, for example Zerodur® mentioned above. If appropriate, the main body can have, in the region of the surface, a coating containing the material forming the volatile hydride, for example a surface coating containing (typically amorphous) silicon or consisting of (typically amorphous) silicon.

In a further embodiment, the main body is formed at a non-optical component. Such a non-optical component is generally arranged outside the beam path of the EUV radiation. The non-optical component can be for example a wall of a vacuum chamber, etc. The non-optical component or the main body thereof is generally not formed from quartz glass or a glass ceramic.

In one embodiment, the main body is formed from a metallic material, preferably from high-grade steel, in particular from nitrogen-containing high-grade steel. The component comprising such a main body is generally a non-optical component. The metallic material can contain the or a material that forms volatile hydrides. This is typically the case for nitrogen-containing (austenitic) high-grade steel, which is offered under the trade name Nironic®, since the alloys used there generally have a small proportion of Si. However, the metallic material of the main body can also be free of materials that form volatile hydrides. In this case, typically the surface coating—described further above—composed of the material that forms volatile hydrides, e.g. composed of silicon, is applied on the metallic material and the main body serves as a substrate for a reflective optical element.

In a further embodiment, the optical arrangement additionally comprises at least one shield fitted to the surface region of the main body. The shield can be configured as in DE 102017213181.0 cited in the introduction, the entirety of which is incorporated by reference in the content of this application. The shield can be for example a stop separated from the surface region by a gap, said stop being fitted for example at a distance of less than 5 mm from the surface region, or a shield applied on the surface region directly or indirectly.

The shield can additionally reduce the formation of volatile hydrides at the surface region since the shield can reduce the quantity of activated hydrogen that passes to the surface region. The combination of the implantation of noble metal ions with the shield makes it possible to lower the concentration of the ions implanted into the main body and nevertheless to effectively reduce the formation of hydrides. Such a combination is advantageous in particular if the concentration of the ions implanted into the main body is intended to be chosen not to be excessively high.

In a further embodiment, the optical arrangement additionally comprises an EUV light source for generating EUV radiation, an illumination system for illuminating a structured object with the EUV radiation of the EUV light source, and a projection lens for imaging the structured object onto a substrate. In this embodiment, the optical arrangement is an EUV lithography apparatus.

Further features and advantages of the invention are evident from the following description of exemplary embodiments of the invention, with reference to the figures of the drawing, which show details essential to the invention, and from the claims. The individual features may be realized in each case individually by themselves or as a plurality in any desired combination in a variant of the invention.

BRIEF DESCRIPTION OF THE DRAWINGS

Exemplary embodiments are illustrated in the schematic drawing and are explained in the following description. In the figures.

DETAILED DESCRIPTION

In the following description of the drawings, identical reference signs are used for identical or functionally identical components.

Figure 1:
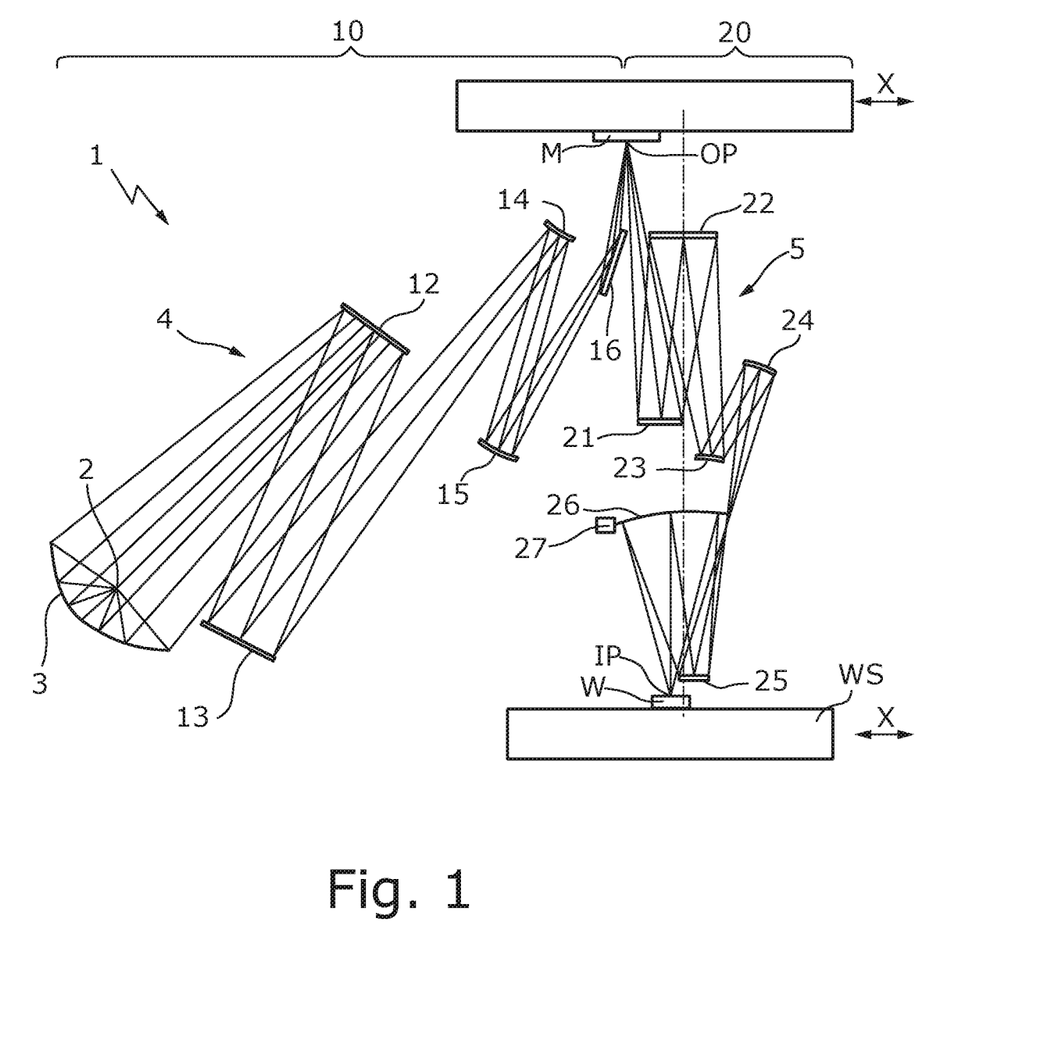
FIG. 1 shows a schematic illustration of an optical arrangement in the form of an EUV lithography apparatus.

FIG. 1 schematically shows the construction of an optical arrangement for EUV lithography in the form of an EUV lithography apparatus 1, specifically of a so-called wafer scanner. The EUV lithography apparatus 1 comprises an EUV light source 2 for generating EUV radiation, which has a high energy density in the EUV wavelength range below 50 nanometers, in particular between approximately 5 nanometers and approximately 15 nanometers. The EUV light source 2 can be configured for example in the form of a plasma light source for generating a laser-induced plasma. The EUV lithography apparatus 1 shown in FIG. 1 is designed for an operating wavelength of the EUV radiation of 13.5 nm. However, it is also possible for the EUV lithography apparatus 1 to be configured for a different operating wavelength in the EUV wavelength range, such as 6.8 nm, for example.

The EUV lithography apparatus 1 furthermore comprises a collector mirror 3 in order to focus the EUV radiation of the EUV light source 2 to form an illumination beam 4 and to increase the energy density further in this way. The illumination beam 4 serves for the illumination of a structured object M with an illumination system 10, which in the present example has five reflective optical elements 12 to 16 (mirrors).

The structured object M can be for example a reflective photomask, which has reflective and non-reflective, or at least much less reflective, regions for producing at least one structure on the object M. Alternatively, the structured object M can be a plurality of micro-mirrors, which are arranged in a one-dimensional or multi-dimensional arrangement and which are, if appropriate, movable about at least one axis, in order to set the angle of incidence of the EUV radiation on the respective mirror.

The structured object M reflects part of the illumination beam 4 and forms a projection beam path 5, which carries the information about the structure of the structured object M and is radiated into a projection lens 20, which produces a projected image of the structured object M or of a respective partial region thereof on a substrate W. The substrate W, for example a wafer, comprises a semiconductor material, for example silicon, and is arranged on a mounting, which is also referred to as a wafer stage WS.

In the present example, the projection lens 20 has six reflective optical elements 21 to 26 (mirrors) in order to produce an image of the structure that is present on the structured object M on the wafer W. The number of mirrors in a projection lens 20 typically lies between four and eight; however, as few as two mirrors can also be used, if configured appropriately.

In addition to the reflective optical elements 3, 12 to 16, 21 to 26, the EUV lithography apparatus 1 also comprises non-optical components, which can be for example carrier structures for the reflective optical elements 3, 12 to 16, 21 to 26, sensors, actuators, etc. FIG. 1 shows by way of example one such non-optical component 27 in the form of a carrier structure, which serves to hold the sixth mirror 26 of the projection lens 20.

The reflective optical elements 3, 12 to 16 of the illumination system 10 and the reflective optical elements 21 to 26 of the projection lens 20 are arranged in a vacuum environment in which a hydrogen plasma prevails. Uncovered surface regions 30 that are exposed to the vacuum environment therefore come into contact with activated hydrogen in the form of hydrogen ions $H^+$ and hydrogen radicals $H^*$.

Figure 2A:
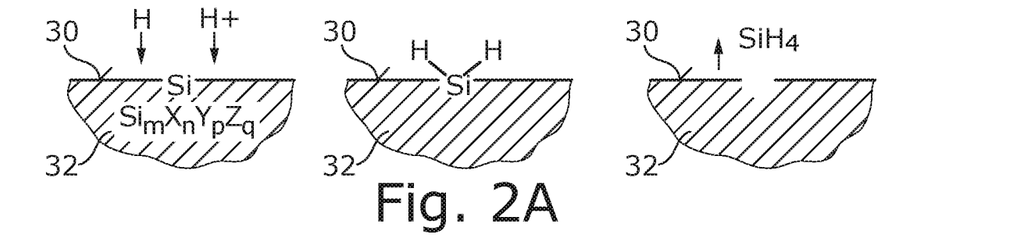
FIG. 2A shows a schematic illustration of a surface region of an Si-containing main body which is exposed to activated hydrogen.
Figure 2B:
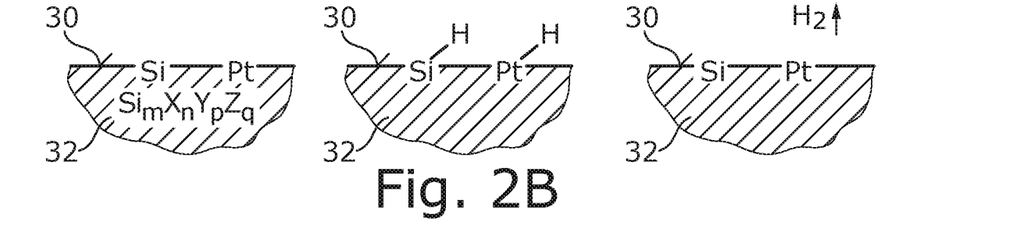
FIG. 2B shows a schematic illustration analogous to FIG. 2A in which at the surface region Pt ions are implanted into the main body.

FIGS. 2A and 2B show such an uncovered surface region 30 formed at a main body 32 comprising a silicon-containing material which is present in the form of an (abstract)

chemical compound $Si_mX_nY_pZ_q$ having other chemical elements X, Y, Z. As is illustrated in FIG. 2A, both the hydrogen radicals H* and the hydrogen ions H+ adsorb on the surface region 30 and form with the silicon a chemical compound in the form of a hydride, e.g. in the form of $SiH_3$ or $SiH_4$. Since $SiH_3$ and $SiH_4$ are volatile chemical compounds, these desorb into the gas phase and leave behind an etched surface region 30 of the main body 32. The desorbed hydrides, e.g. in the form of $SiH_3$ or $SiH_4$, can deposit at the optical surfaces of the reflective optical elements 3, 12 to 16, 21 to 26 of the EUV lithography apparatus 1 and cause a loss of reflection there. A cross-contamination by desorbed hydrides thus occurs in the EUV lithography apparatus 1.

FIG. 2B shows a surface region 30 of a main body 32 which, in contrast to that shown in FIG. 2A, is doped with Pt ions. The Pt ions are implanted into the main body 32 at the surface region 30 or below the surface region 30. The Pt ions serve as a catalyst for a recombination reaction of the activated hydrogen H+, H* into molecular hydrogen ($H_2$) at the surface region 30. The molecular hydrogen $H_2$ desorbs from the surface region 30 and transitions to the gas phase, thereby preventing the formation of volatile hydrides such as e.g. $SiH_4$. In addition, the surface region 30 or the main body 32 is not altered, that is to say that an etching process does not occur.

It is therefore advantageous, at surface regions 30 exposed to hydrogen ions H+ and/or hydrogen radicals H* and containing at least one material which forms a readily volatile hydride with activated hydrogen H*, H+, e.g. Si, Ge, Sn, Zn or In, to implant Pt ions or other types of ions that form a catalyst for the recombination to form molecular hydrogen $H_2$. Said ions can be in particular Pt or other noble metal ions, for example Pd, Au, Rh or Ir.

Figure 3A:
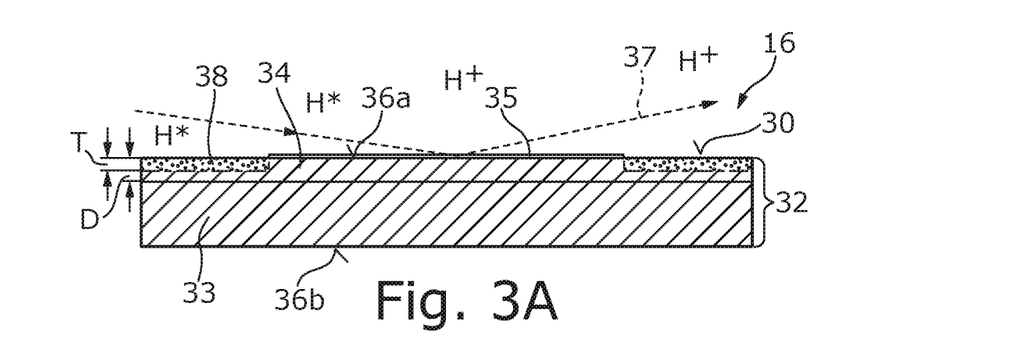
FIGS. 3A and 3B show schematic illustrations of optical elements in which Pt ions are implanted into a main body at various surface regions, namely laterally outside a reflective-coating region (FIG. 3A) or circumferentially on a further surface that adjoins the reflective coating region (FIG. 3B)

FIG. 3A shows a sectional illustration of the fifth optical element 16 of the illumination system 10, which comprises a main body 32 formed from a solid body 33 composed of aluminium, and further comprises a surface coating 34 composed of silicon applied on the solid body. The solid body 33 can also be formed from copper or from some other metallic material. The main body 32 serves as a substrate for a reflective coating 35 applied on a planar front side 36a of the main body 32, in particular to the Si surface coating 34. The main body 32, at its likewise planar rear side 36b, is applied area-ly on a mount (not illustrated pictorially in FIGS. 3A and 3B). The reflective optical element 16 is illustrated in a greatly simplified manner in FIGS. 3A and 3B, even though said reflective optical element in actuality has a more complex geometry in practice.

Figure 3B:
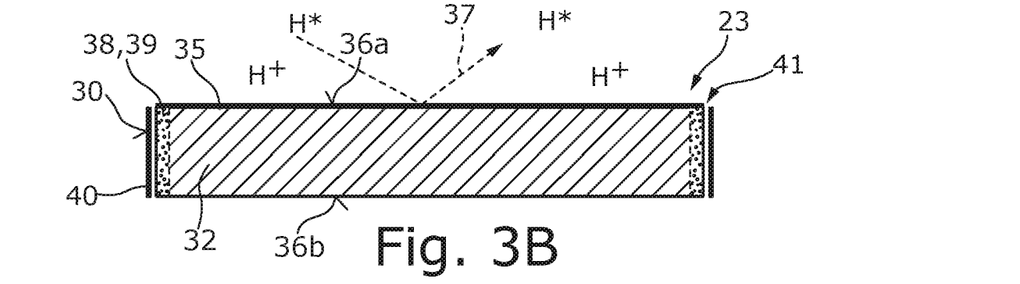

In the examples shown in FIGS. 3A and 3B, the reflective coating 35 is configured for reflecting EUV radiation 37 incident with grazing incidence on the front side 36a of the main body 32, i.e., for EUV radiation 37 incident on the front side 36a of the main body 32 at an angle of incidence of more than approximately 60°. In the example shown, the reflective coating 35 is formed by a single layer, but can also be formed by a multilayer system.

While the front side 36a of the main body 32 is protected against the activated hydrogen H+, H* in the region of the reflective coating 35, this is not the case for a ring-shaped surface region 30 surrounding the reflective coating 35 at the front side 36a of the main body 32, that is to say that the ring-shaped surface region 30 is exposed to the hydrogen plasma H*, H+.

In order to prevent the formation of volatile Si hydrides at the uncovered surface region 30 of the reflective optical element 16, Pt ions 38 are implanted into the main body 32, in particular into the Si surface coating 34 of the main body 32. The implanted Pt ions 38 are restricted to the Si surface coating 34, specifically to an implantation depth T in a value range of between approximately 0.5 nm and approximately 1000 nm, preferably between 0.5 nm and 100 nm, proceeding from the ring-shaped surface region 30. By contrast, the Si surface coating 34 has a thickness D in the range of a number of millimeters, that is to say that the implanted Pt ions 38 are restricted to a near-surface volume region of the Si surface coating 34. As can likewise be discerned in FIG. 3A, the Pt ions 38 are implanted only at or below the ring-shaped surface region 30, but not at or below the reflective coating 35. The solid body 33—consisting of Al—of the main body 32 does not have to be protected against the reactive hydrogen H+, H* since Al generally does not form volatile hydrides with the activated hydrogen H*, H+.

FIG. 3B shows a reflective optical element 23 arranged in the projection lens 20 of the EUV lithography apparatus 1. The reflective optical element 23 has a reflective coating 35 at its front side 36a, which reflective coating, in the example shown, is a multilayer coating for reflecting EUV radiation 37 incident with normal incidence on the reflective optical element 23. For this purpose, the reflective multilayer coating 35 has a plurality of layers having alternately a high and a low real part of the refractive index.

The reflective optical element 23 shown in FIG. 3B is also exposed to activated hydrogen H+, H* during operation of the EUV lithography apparatus 1. In order to prevent the material of the solid main body 32, which is $SiO_2$ in the example shown, from being exposed to the surrounding hydrogen plasma H+, H*, Pt ions 38 are implanted at a circumferential lateral surface region 30 of the main body 32. In order to intensify the catalytic effect of the Pt ions 38, nitrogen ions 39 are additionally implanted at the circumferential lateral surface region 30. Other ions that intensify the catalytic effect of the Pt ions 38 can also be implanted into the main body 32 at the lateral surface region 30, for example noble gas ions, e.g. Ar ions or Kr ions, boron ions or phosphorous ions. In the example shown in FIG. 3B, the rear side 36b of the main body 32 is secured area-ly to a carrier component (not illustrated pictorially) and, therefore, just like the front side 36a of the main body 32 that is covered area-ly by the reflective coating 35, is not exposed to the activated hydrogen H+, H*.

In order additionally to protect the lateral surface region 30 of the main body 32 against an etching effect of the activated hydrogen H+, H*, in the example shown in FIG. 3B, a shield in the form of a stop 40 is provided at the reflective optical element 23. For this purpose, the stop 40 covers the lateral surface region 30 of the reflective optical element 23 at a defined distance with the formation of a gap 41, the gap width of which is less than approximately 5 mm in the example shown. Other measures for shielding the lateral surface region 30 against the activated hydrogen H+, H* can also be provided; by way of example, a shield in the form of a coating or a protective film can be applied on the lateral surface region 30.

Figure 4:
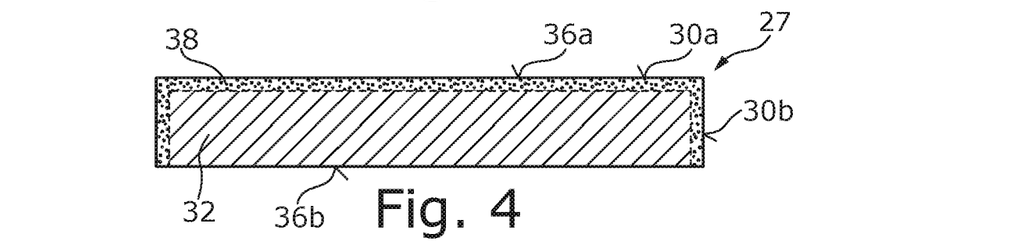
FIG. 4 shows a schematic illustration of a non-optical component in which at two surface regions Pt ions are implanted into a main body composed of nitrogen-containing high-grade steel.

FIG. 4 shows highly schematically the non-optical component 27 from FIG. 1, which, in the example shown, is formed from a solid main body 32 composed of high-grade steel, in particular composed of nitrogen-containing high-grade steel (Nitronic®). This type of high-grade steel typically contains a small proportion of silicon, such that the main body 32, in particular the front side forming a first surface region 30a and also a circumferential side surface forming a second surface region 30b of the main body 32, has to be protected against activated hydrogen H+, H*. For this purpose, noble metal ions are implanted into the main body 32 both at the first and at the second surface region 30a, 30b. The rear side 36b of the non-optical component 27 in the form of the carrier component is secured area-ly to a further component (not illustrated pictorially), such that this does not have to be protected against the activated hydrogen H⁺, H*.

In all of the examples described further above, the noble metal ions 38 do not form a continuous layer, but rather are implanted into the main body 32 in clusters of not more than approximately 200 atoms. This can be achieved by suitably selecting the parameters in the implantation of the noble metal ions 38. By way of example, it has proved to be advantageous if the ion dose during the ion implantation, which can be carried out for example by a plasma immersion ion implantation or an ion implantation with a linear accelerator, is chosen not to be too high. The ion dose during the implantation of the noble metal ions 38 should typically lie between approximately $10^{11}/cm^2$ and $10^{17}/cm^2$, preferably between $10^{11}/cm^2$ and $10^{15}/cm^2$.

Main bodies 32 which are formed from materials different from those described further above can also be protected against the formation of volatile hydrides by the implantation of noble metal ions 38. Said materials can for example be glass ceramics, e.g. Zerodur®, mono- or polycrystalline silicon, etc.

What is claimed is:

1. An optical arrangement for extreme ultraviolet (EUV) lithography, comprising:
    at least one component having a main body substrate with at least one surface region which is exposed to activated hydrogen (H⁺, H*) during operation of the optical arrangement,
    wherein the main body substrate contains at least one material which forms at least one volatile hydride upon contact of the surface region with the activated hydrogen,
    wherein noble metal ions are implanted into the main body substrate at the surface region, and
    wherein the noble metal ions are implanted into the main body substrate with an implantation depth of between 0.5 nm and 1000 nm.

2. The optical arrangement according to claim 1, wherein the noble metal ions are selected from the group consisting of: Pt, Pd, Au, Rh, Ir.

3. The optical arrangement according to claim 1, wherein the material which forms the volatile hydride is selected from the group consisting of: Si, Ge, Sn, Zn, In.

4. The optical arrangement according to claim 1, wherein the noble metal ions are implanted into the main body substrate with an implantation depth of between 0.5 nm and 100 nm.

5. The optical arrangement according to claim 1, wherein the noble metal ions are implanted into the main body substrate in clusters of not more than 200 atoms.

6. The optical arrangement according to claim 1, wherein boron ions, phosphorous ions, nitrogen ions and/or noble gas ions are additionally implanted into the main body substrate at the surface region.

7. The optical arrangement according to claim 1,
    wherein the main body substrate forms a substrate of a reflective optical element, and
    wherein the at least one component further comprises a reflective coating, which is configured to reflect EUV radiation, applied on the main body substrate.

8. The optical arrangement according to claim 7,
    wherein the main body substrate is formed from quartz glass, from a glass ceramic or from silicon, or
    wherein the main body substrate further comprises a surface coating containing material forming the volatile hydride.

9. The optical arrangement according to claim 8, wherein the main body substrate is formed from titanium-doped quartz glass or from mono- or polycrystalline silicon.

10. The optical arrangement according to claim 1, wherein the at least one component having the main body substrate is a non-optical component.

11. The optical arrangement according to claim 1, wherein the main body substrate comprises a solid body formed from a metallic material and a surface coating containing material forming the volatile hydride.

12. The optical arrangement according to claim 11, wherein the solid body is formed from nitrogen-containing high-grade steel.

13. The optical arrangement according to claim 1, further comprising at least one shield fitted to the surface region of the main body substrate.

14. The optical arrangement according to claim 1, further comprising:
    an EUV light source configured to generate EUV radiation for the EUV lithography,
    an illumination system configured and arranged to illuminate a structured object with the EUV radiation generated by the EUV light source, and
    a projection lens configured and arranged to image the structured object onto a substrate of semiconductor material.

15. An optical arrangement for extreme ultraviolet (EUV) lithography, comprising:
    at least one component having a main body substrate with at least one surface region which is exposed to activated hydrogen (H⁺, H*) during operation of the optical arrangement,
    wherein the main body substrate contains at least one material which forms at least one volatile hydride upon contact of the surface region with the activated hydrogen,
    wherein noble metal ions are implanted into the main body substrate at the surface region, and
    wherein the noble metal ions are implanted into the main body substrate in clusters of not more than 200 atoms.

16. The optical arrangement according to claim 15, wherein the noble metal ions are selected from the group consisting of: Pt, Pd, Au, Rh, Ir.

17. The optical arrangement according to claim 15, wherein boron ions, phosphorous ions, nitrogen ions and/or noble gas ions are additionally implanted into the main body substrate at the surface region.

18. An optical arrangement for extreme ultraviolet (EUV) lithography, comprising:
    at least one component comprising a main body forming a substrate of a reflective optical element,
    wherein the substrate includes a surface region provided with a reflective coating configured to reflect EUV radiation, and at least one surface region which is exposed to activated hydrogen (H⁺, H*) during operation of the optical arrangement,
    wherein the substrate contains at least one material which forms at least one volatile hydride upon contact of the at least one surface region with the activated hydrogen, and wherein the at least one surface region exposed to the activated hydrogen is doped with noble metal ions to form an implanted non-continuous layer of ions in the substrate below the at least one surface region.

19. The optical arrangement according to claim 18, wherein the noble metal ions in the non-continuous layer of ions are implanted in clusters of not more than approximately 200 atoms.

20. The optical arrangement according to claim 18, wherein the at least one surface region doped with noble metal ions is formed outside the surface region provided with the reflective coating.

\* \* \* \* \*

UNITED STATES PATENT AND TRADEMARK OFFICE
CERTIFICATE OF CORRECTION

PATENT NO. : 11,372,335 B2  
APPLICATION NO. : 17/026925  
DATED : June 28, 2022  
INVENTOR(S) : Gonchar

Page 1 of 1

It is certified that error appears in the above-identified patent and that said Letters Patent is hereby corrected as shown below:

On the Title Page

Page 2, Column 2, Line 11, delete "an Meterogeneous" and insert -- and Heterogeneous --.

Signed and Sealed this
Twenty-sixth Day of September, 2023

Katherine Kelly Vidal
*Director of the United States Patent and Trademark Office*